(12) United States Patent
Yu et al.

(10) Patent No.: US 10,015,889 B2
(45) Date of Patent: Jul. 3, 2018

(54) METHOD FOR CONSTRUCTING AN EXTERNAL CIRCUIT STRUCTURE

(71) Applicant: NATIONAL CENTER FOR ADVANCED PACKAGING CO., LTD., Wuxi, Jiangsu Province (CN)

(72) Inventors: Zhongyao Yu, Beijing (CN); Yu Sun, Beijing (CN); Zhidan Fang, Beijing (CN)

(73) Assignee: National Center for Advanced Packaging Co., Ltd., Wuxi, Jiangsu (CN)

( * ) Notice: Subject to any disclaimer, the term of this patent is extended or adjusted under 35 U.S.C. 154(b) by 311 days.

(21) Appl. No.: 14/318,142

(22) Filed: Jun. 27, 2014

(65) Prior Publication Data

US 2015/0096173 A1 Apr. 9, 2015

(30) Foreign Application Priority Data

Oct. 8, 2013 (CN) .......................... 2013 1 0463172

(51) Int. Cl.
*H05K 3/46* (2006.01)
*H05K 3/00* (2006.01)
*H05K 3/10* (2006.01)

(52) U.S. Cl.
CPC ......... *H05K 3/4644* (2013.01); *H05K 3/0055* (2013.01); *H05K 3/0035* (2013.01); *H05K 3/108* (2013.01); *H05K 2203/0353* (2013.01); *H05K 2203/143* (2013.01); *Y10T 29/49167* (2015.01)

(58) Field of Classification Search
CPC .. H05K 3/4644; H05K 3/0055; H05K 3/0035; H05K 3/108; H05K 2203/0353; H05K 2203/143; Y10T 29/49167
See application file for complete search history.

(56) References Cited

U.S. PATENT DOCUMENTS 5,311,660 A * 5/1994 Alpaugh .............. H05K 3/0055
134/28
5,648,125 A * 7/1997 Cane ................... C23C 18/1893
427/210
7,588,835 B2 * 9/2009 Yamashita ................ C23C 8/02
148/277

* cited by examiner

*Primary Examiner* — Peter DungBa Vo
*Assistant Examiner* — Jeffrey Carley
(74) *Attorney, Agent, or Firm* — Jingming Cai; SAC Attorneys LLP

(57) ABSTRACT

A method for constructing an external circuit structure is provided. The method is applied to an inner circuit substrate, wherein, the method comprises: laminating a copper foil and a prepreg on the inner circuit substrate; wherein, the prepreg is laminated between the copper foil and the inner circuit substrate; drilling at least one blind via from the copper foil to reach the copper circuit of the inner circuit substrate; removing smear generated in the at least one blind via during the drilling process; corroding off the copper foil; electroless copper plating on the prepreg to form an electroless plating copper layer on the prepreg; wherein, during the electroless copper plating process, a swelling process without desmearing process is implemented.

10 Claims, 12 Drawing Sheets

METHOD FOR CONSTRUCTING AN EXTERNAL CIRCUIT STRUCTURE

CROSS-REFERENCE TO RELATED APPLICATION

This application claims priority from CN Patent Application Serial No. 201310463172.8, filed on Oct. 8 2013, the entire contents of which are incorporated herein by reference for all purposes.

FIELD OF THE INVENTION

The present invention is related to manufacturing technology of semiconductor or solid-state devices, especially related to a method for constructing an external circuit structure.

BACKGROUND OF THE INVENTION

With continuous development of large-scale integrated circuits, circuit lines become thinner and thinner as the 22 nm circuit line has been widely used in mass production. The thinning requirement of circuit lines brings about an unprecedented challenge to devices and processes. In order to further develop the chip density and the signal processing capability of per unit circuit area, a 3D packaging process was therefore invented. In the 3D packaging process, chips are stacked to form a 3D integrated packaging structure so that the packing density of per unit circuit area can be increased.

With the development of the 3D packaging process, the requirement of an organic substrate becomes more strict, as the circuit line/space of the organic substrate has reduced from 100 μm (PCB level) to 30-50 μm (mass production level), the surface roughness of the copper circuit should become smaller. Normally, the roughness of copper in PCB (Printed Circuit Board) is Rz=5-7 μm while that of substrates is below 5 μm. For copper lines which line/space is 10-20 μm, the roughness is required under 2 μm; Or, a short-circuit fault may be caused due to a circuit deformation or the residual copper between circuit lines and further a high accuracy interconnection structure cannot be achieved.

Moreover, the roughness of copper lines on the organic substrates should meet the requirements of different transmission frequencies of signals. For 10GHz signals, the roughness of copper circuit surface should be no more than 1 μm. For 100GHz signals, the roughness should be less than 0.1 μm.

A conventional process to improve the surface roughness is to etch the surfaces of circuit boards by an oxidant. Since different surface molecules have different reactions to the oxidant, some functional groups are removed to form etching pits. The removed functional groups are not evenly distributed on the surface of circuit boards, so that a rough surface can be achieved due to the uneven distributed etching pits. Conventional etching process may bring a big height difference of the etching pits as ranging from several μm to even a larger scope.

In the prior art, three processes are normally used to produce the organic substrate and PCB: an additive process, subtractive process and semi-additive process. While, due to the high development of IC package technology, the feature size of the package substrate has decreased from 100 μm to 50 μm. Some advanced package substrates have even reached a level of 25-30 μm, and some suppliers are attempting the mass production of circuits with a line width of 15 μm.

As for the circuits with a line/space larger than 50 μm, the subtractive process is normally used, during which a prepreg is applied as an insulation medium and the external circuit structure is constructed by laminating a copper foil onto the prepreg under high temperature.

As for the circuits with a line/space below 50 μm, the subtractive process is entirely not applicable, since it cannot guarantee the size accuracy of circuits. The additive process is barely used since the electroless copper plating is too slow.

The Semi-Additive Process, namely SAP, has become a main process to manufacture organic substrates with high-density circuits and has been widely used in constructing high accuracy circuit structures. During a conventional SAP, the electroless copper plating process is directly implemented on the resin substrate surface. In order to achieve a better adhesion of copper lines on the resin substrate, the resin substrate surface should be coarsened to obtain a certain roughness. However, as there is glass cloth comprised in the normal prepreg, during lamination of the prepreg onto the surface of the inner circuit substrate, the glass cloth may be exposed due to the resin flowing. Or only a very thin resin layer may be left on the surface of glass cloth, after the coarsening process on the resin substrate surface, the very thin resin layer may be etched off, which will also lead to the exposure of glass cloth. In this case, the electroless copper plating process may not be able to be implemented, or the adhesion of the electroless plating copper layer may be low, on some regional surfaces where the glass cloth is exposed.

To solve the problem in SAP, a Modified Semi-Addictive Process, namely MSAP, is used to produce the organic substrate with a line/space below 50 μm. During the MSAP process, a 3 μm ultrathin copper foil is laminated onto the prepreg's surface and then is reduced to 1-2 μm. A plating pattern is formed through a dry film patterning process; after an electrolytic copper plating process, the dry film is removed and the copper foil under the dry film is corroded off to form circuits. Since the material density of the ultrathin copper foil is much larger than the pattern plating copper, the corroding speeds of them are greatly different. In this case, the pattern plating copper on the whole surface may also be quickly corroded during the corroding process of the ultrathin copper foil. In summary, the final circuit accuracy may be seriously influenced by the mask design in pattern plating, parameters of electroplating, thickness of the ultrathin copper foil and parameters of the flash etching process of the ultrathin copper foil. So, it is difficult to apply MASP on producing the organic substrate with a line/space below 20 μm. Consequently, although the MSAP is able to manage the adhesion of circuits on the substrate, it cannot achieve a high accuracy of the circuit.

Therefore, due to the strict requirements of the insulation ability, adhesion and circuit accuracy, normal materials are not suitable for producing an organic substrate with a line width below 50 μm.

However, the Mitsubishi Company has provided a material named PCF (Primer Coated Copper Foil) which can satisfy the mentioned requirements.

FIG. 1 illustrates the structure of a PCF in the prior art. The PCF is obtained by coating a resin layer 9' on a low roughness copper foil 8'. The thickness of the resin layer 9' is around 2-3 μm.

FIG. 2a~2b and FIG. 3a~3i illustrate the flow chart of a SAP using a PCF in the prior art. As shown in FIG. 2a~2b and FIG. 3a~3i, the process includes following steps.

Step 101: as shown in FIG. 3a and 3b, two prepregs 11' are respectively laminated on both surfaces of an inner circuit substrate 1', and then a PCF 10' is laminated onto each of the prepregs 11'.

Step 102: as shown in FIG. 3c, blind vias 3' are drilled through the PCF 10' and the prepreg 11' by a laser drilling process.

Step 103: blind vias 3' are swelled and the smear in the blind vias 3' is removed.

Step 104: as shown in FIG. 3d, the copper foil 8' is removed from the PCF 10'.

Step 105: all the surface of the resin layer 9' are swelled.

Step 106: as shown in FIG. 3e, an electroless copper plating process is implemented on the resin layer 9' and the blind vias 3' to form an electroless plating copper layer 4', and the electroless copper plating process includes: acid soaking, cleaning, micro corroding, pre-soaking, activating, reducing and electroless copper plating.

Step 107: as shown in FIG. 3f, a photolithography process is implemented to construct a dry film layer 5' on the electroless plating copper layer 4', wherein pattern plating windows 6' are exposed on proper locations of the dry film layer 5' including positions corresponding to blind vias 3' for following electroplating.

Step 108: as shown in FIG. 3f, an electroplating plating process is implemented on the pattern plating windows 6' to form a copper plating pattern 7'.

Step 109: as shown in FIG. 3h, the dry film 5' is removed by using stripping liquid to form a substrate with the copper plating pattern 7'.

Step 110: as shown in FIG. 3i, the whole substrate is dipped in etchant to corrode off the remained electroless plating copper layer 4'. Since the electroless plating copper layer 4' is very thin and its corroding speed is very rapid, an external circuit structure is formed after the electroless plating copper layer 4' is corroded off.

More external circuit structures can be further constructed by repeating the Steps 101~110.

In the SAP using a PCF, the surface roughness of the copper foil is transferred to the resin layer. After the copper foil is removed, the electroless copper plating process and the subsequent electroplating plating process are directly implemented on the resin layer. The resin layer of the PCF which is a patented product belonging to Mitsubishi Company is made of special materials. The electroless copper plating process can be directly implemented on the resin layer to achieve an excellent adhesion.

In a SAP using the PCF in the prior art, the swelling process is implemented in the blind vias and the resin layer.

Moreover, the Ajinomoto Company has produced a material named ABF (Ajinomoto Build-up Film). The ABF is a kind of prepreg material without glass cloth. By using the ABF as the insulation layer, an excellent external layer circuit structure can be achieved through the SAP. Therefore it has been widely used in the manufacture of advanced circuit substrates. The resin material of the ABF is obtained by adding micro glass powder into epoxy. After a lamination process, a rough resin surface is achieved by forming etching pits on the surface of the resin material after etching off the micro glass powder. Currently, the diameter of the monox powder in GX-13 epoxy resin, a featured product of the Ajinomoto Company, is below 5 μm and GX-13 is used in the SAP to construct a circuit structure with a line width below 15 μm. Subsequent products with even smaller micro glass powder may be produced, actually, produces with micro glass powder which diameter is smaller than 1 μm have also been produced.

FIG. 4a~4b and FIG. 5a~5h illustrate the flow chart of a SAP using an ABF. As shown in FIG. 4a~4b and FIG. 5a~5h, the process includes following steps.

Step 201: as shown in FIG. 5a, an inner circuit substrate 1' is manufactured. Step 202: as shown in FIG. 5b, ABFs 2' are respectively laminated on both surfaces of the inner circuit substrate 1'.

Step 203: as shown in FIG. 5c, blind vias 3' are drilled on the ABF 2' through a laser drilling process.

Step 204: as shown in FIG. 5d, an electroless copper plating process is implemented on the ABF to form an electroless plating copper layer 4'; the electroless copper plating process includes: swelling, desmearing, neutralizing, acid soaking, cleaning, micro corroding, pre-soaking, activating, reducing and electroless copper plating.

Step 205: as shown in FIG. 5e, a photolithography process is implemented to construct a dry film layer 5' on the electroless plating copper layer 4'. Pattern plating windows 6' are exposed on proper locations of the dry film layer 5' including positions corresponding to blind vias 3' for following electroplating.

Step 206: as shown in FIG. 5f, an electroplating process is implemented on the pattern plating windows 6' to form a copper plating pattern 7'.

Step 207: as shown in FIG. 5g, the dry film 5' is removed by using stripping liquid to form a substrate with the copper plating pattern 7'.

Step 208: as shown in FIG. 5h, the whole circuit board is dipped in etchant to corrode off the remained electroless plating copper layer 4'. Since the electroless plating copper layer 4' is very thin and its corroding speed is very rapid, an external circuit structure is formed after the electroless plating copper layer 4' is corroded off In a SAP using the ABF in the prior art, a desmearing process is required after the swelling process to remove the monox powder, and the swelling process improves roughening of the resin surface.

Moreover, the price of the PCF is much higher than the prepreg, the SAP using the PCF costs twice as much as the cost of conventional subtractive manufacture processes which only using one layer of the prepreg. The ABF is 4-5 times expensive than the prepreg due to its costs and its patent fee, and it is twice as expensive as the cost of the combination of the PCF and prepreg. Hence, the cost of SAP using either the ABF or the PCF is pretty high.

SUMMARY OF THE INVENTION

To solve the problems mentioned above, a method for constructing an external circuit structure is provided by the present invention, which can reduce the cost of fine line circuit substrates.

A method for constructing an external circuit structure provided by an embodiment of the present invention is applied to an inner circuit substrate, which comprises: a core board, both surfaces of which coated with copper circuits; at least one via-hole drilled through the core board and filled with conductive medium, the method comprises:

laminating a copper foil and a prepreg onto the inner circuit substrate; wherein, the prepreg is laminated between the copper foil and the inner circuit substrate;

drilling at least one blind via from the copper foil to reach the copper circuit of the inner circuit substrate;

desmearing the at least one blind via;

corroding off the copper foil;

electroless copper plating on the prepreg to form an electroless plating copper layer on the prepreg; wherein, during the electroless copper plating process, a swelling process without desmearing process is implemented.

In the technical scheme of the present invention, the desmearing process is implemented before the copper foils on the prepregs are corroded off, thus the prepreg can be protected by the copper foil from being etched by the desmearing liquid, so that the surface roughness of the prepreg, which is transferred from the copper foil, can be remained.

During the electroless copper plating process, only swelling but no desmearing is required, so that the swelled prepreg surface can be obtained and remained, and then the molecular separation of the prepreg surface can be increased and the superficial area of the micro structure can be extended, which can make the palladium atoms in activation liquid easily be absorbed by the prepreg surface in subsequent steps, and finally an excellent adhesion of the electroless plating copper layer can be achieved.

During the whole method provided by the present invention, only common copper foils and prepreg material are used instead of high-cost materials in the prior art such as PCF or ABF; so that the material cost is largely reduced, which is only half of using the PCF and ⅓ of using the ABF.

BRIEF DESCRIPTION OF THE DRAWINGS

To give a further description of the embodiments in the present invention or the prior art, the appended drawings used to describe the embodiments and the prior art will be introduced as follows. Obviously, the appended drawings described here are only used to explain some embodiments of the present invention. Those skilled in the art can understand that other appended drawings may be obtained according to these appended drawings without creative work.

DETAILED DESCRIPTION OF THE INVENTION

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a", "an", and "the" include plural references. The meaning of "in" includes "in" and "on". The term "coupled" implies that the elements may be directly connected together or may be coupled through one or more intervening elements. Further reference may be made to an embodiment where a component is implemented and multiple like or identical components are implemented.

The order of the steps in the present embodiment is exemplary and is not intended to be a limitation on the embodiments of the present invention. It is contemplated that the present invention includes the process being practiced in other orders and/or with intermediary steps and/or processes.

The embodiments of the present invention are described more fully hereinafter with reference to the accompanying drawings, which form a part hereof, and which show, by way of illustration, specific exemplary embodiments by which the invention may be practiced. When illustrating the embodiments of the present invention, the cross-sectional views are exemplary and not enlarged in proportion, which is not intended to be a limitation on the embodiments of the present invention. Besides, three-dimension size having length, width and depth should be involved in practical production.

FIG. 6a~6b and FIG. 7a~7k illustrate the flow chart of a method for constructing an external circuit structure in an embodiment of the present invention. As shown in FIG. 6 and FIG. 7a~7k, the process includes following steps.

Figure 1:
FIG. 1 illustrates the structure of a PCF in the prior art.
Figure 2A:
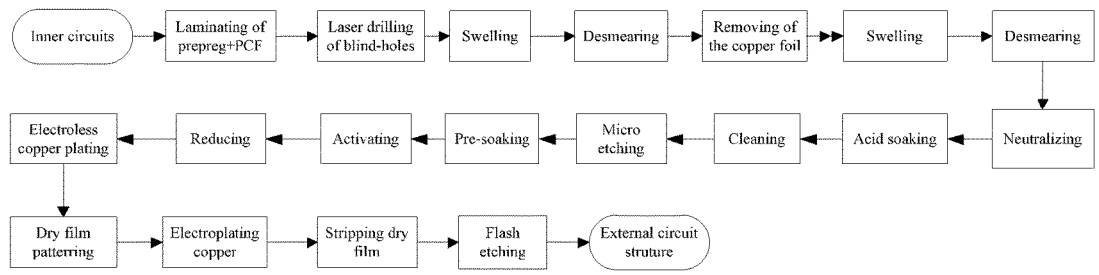
FIG. 2a~2b illustrates the flow chart of a SAP using a PCF in the prior art.
Figure 3A:
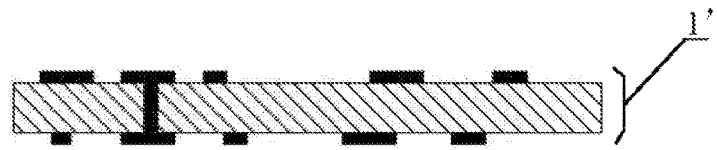
FIG. 3a~3i illustrate a SAP using a PCF in the prior art.
Figure 3B:
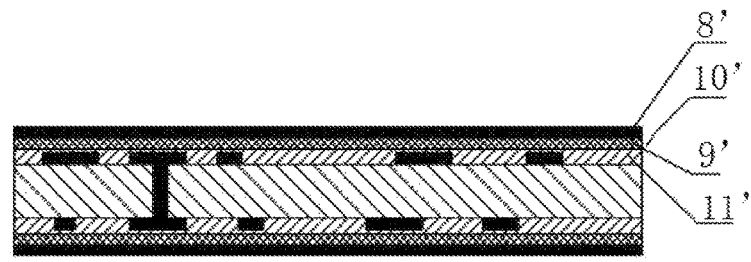
Figure 2B:
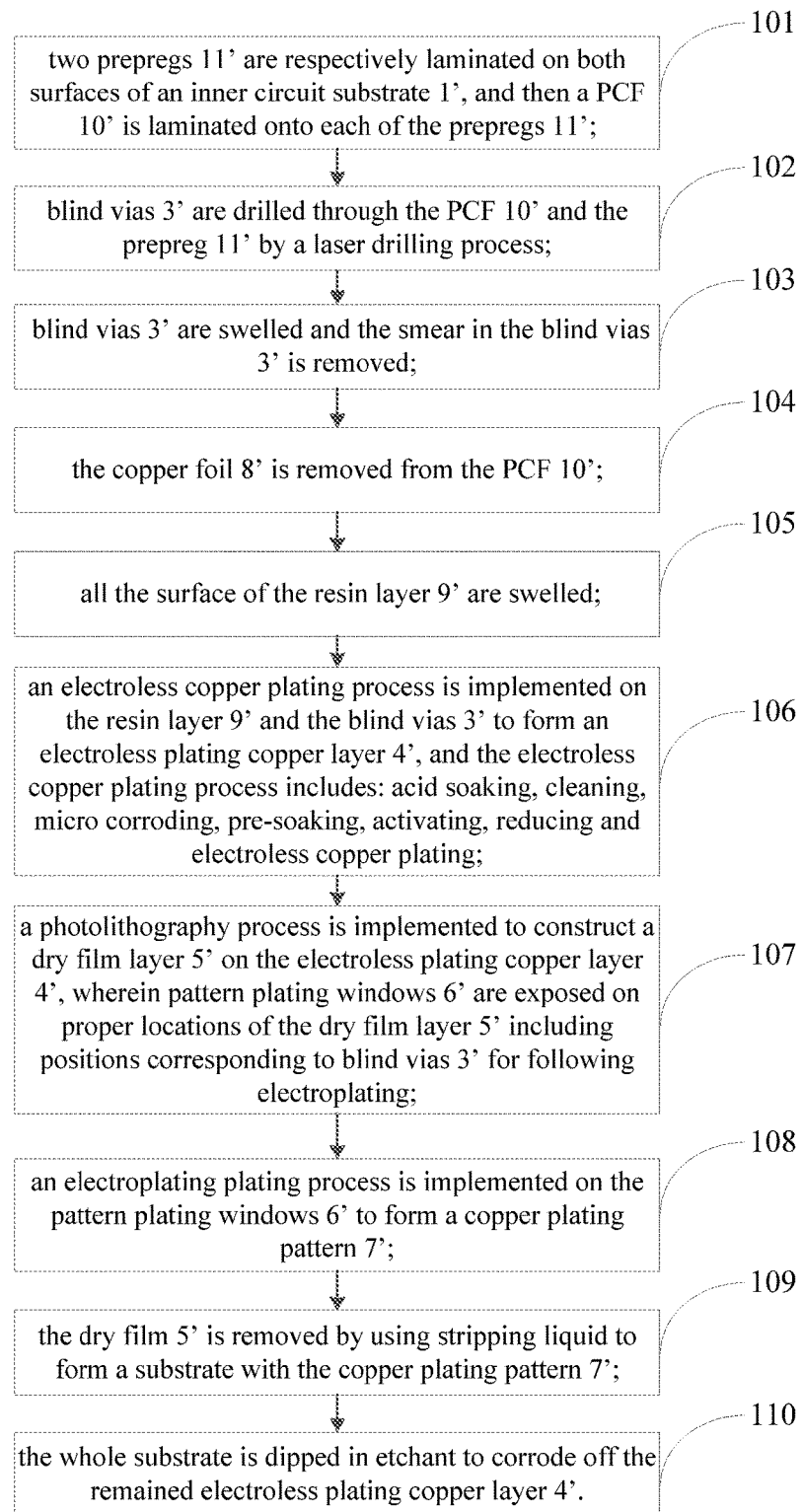
Figure 3C:
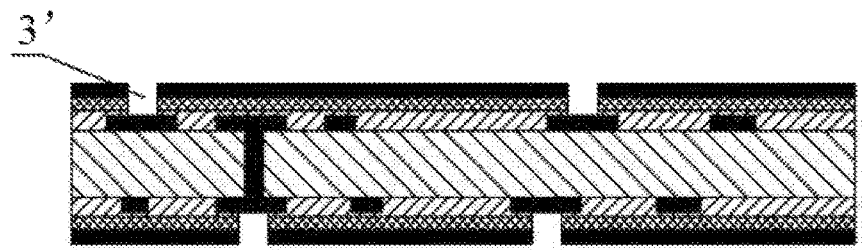
Figure 3D:
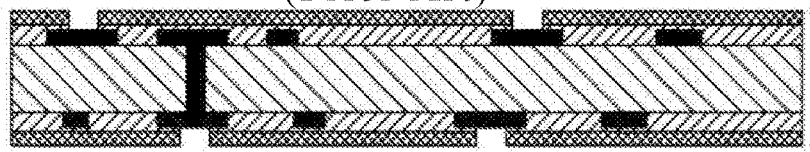
Figure 3E:
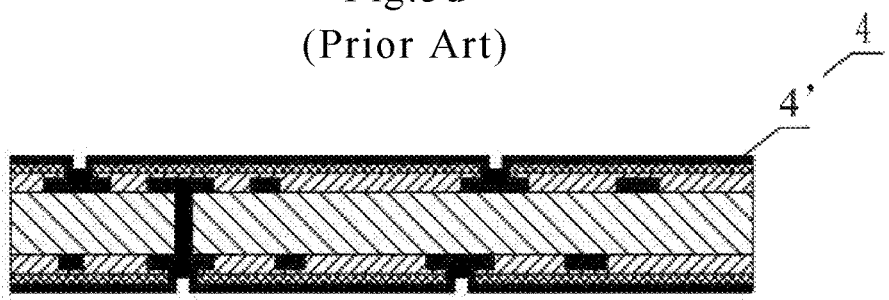
Figure 3F:
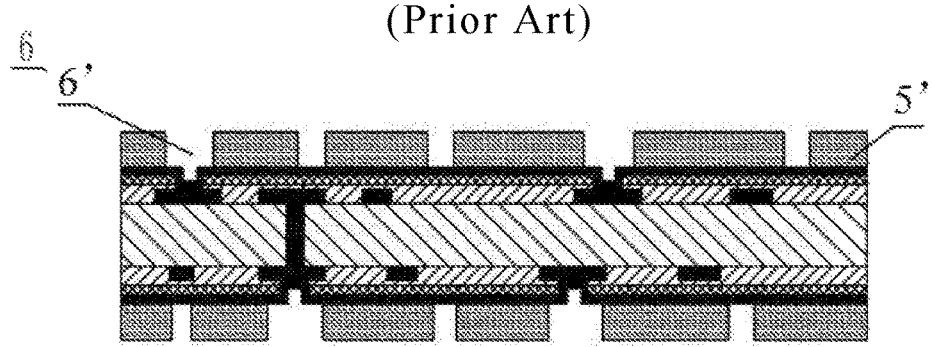
Figure 3G:
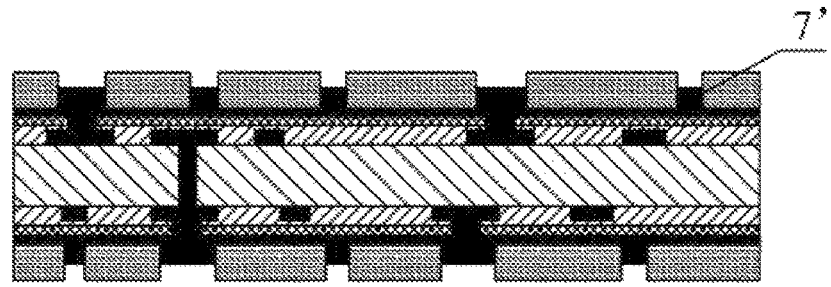
Figure 3H:
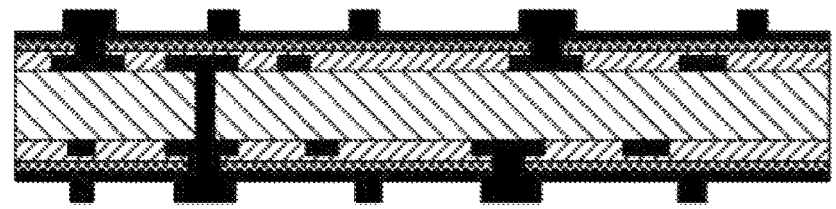
Figure 3I:
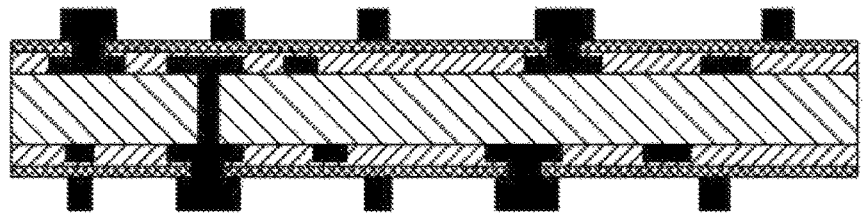
Figure 4A:
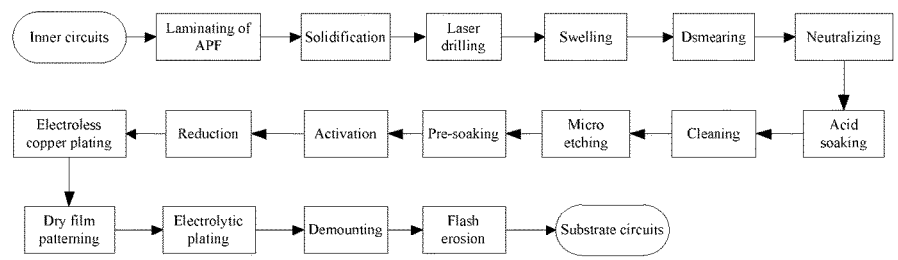
FIG. 4a~4b illustrates the flow chart of a SAP using an ABF in the prior art.
Figure 4B:
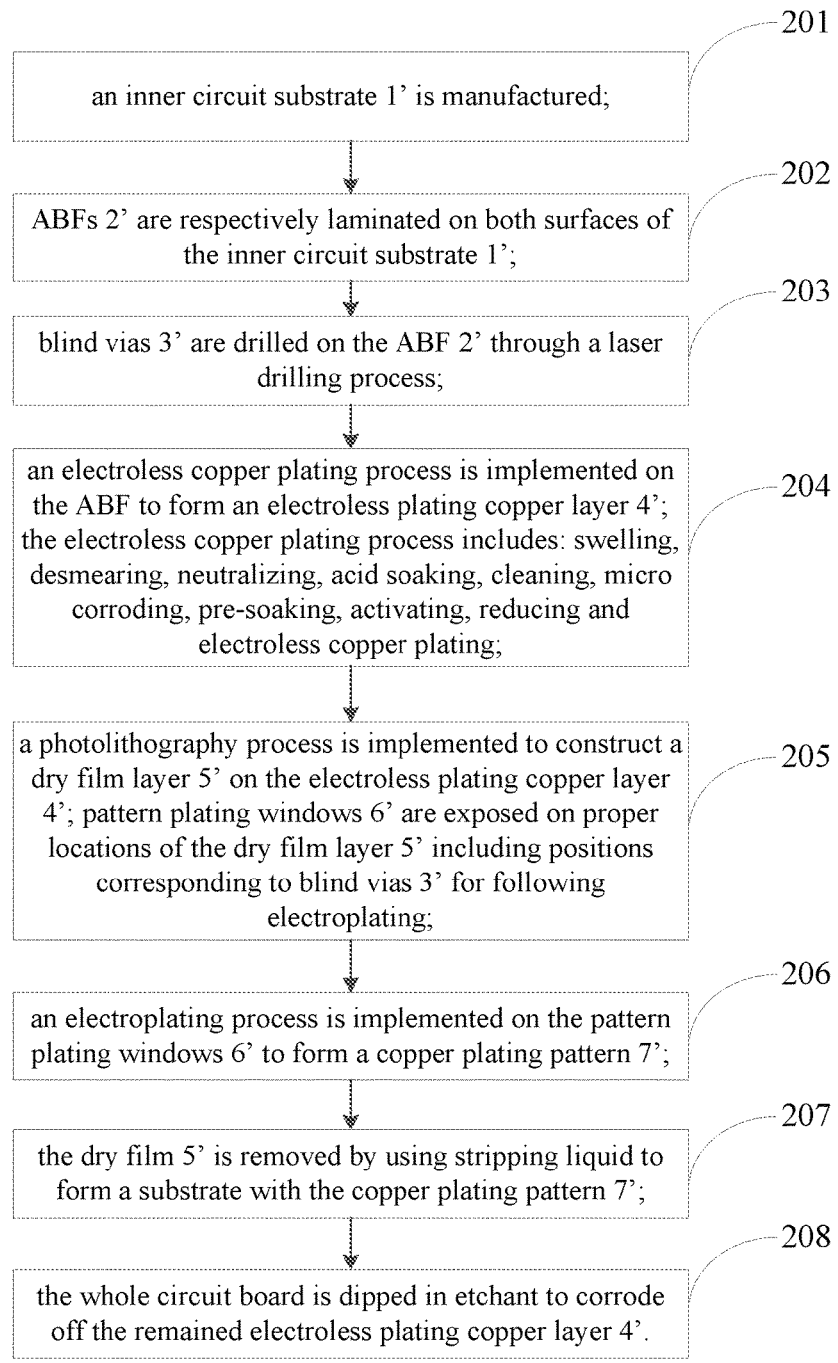
Figure 5A:
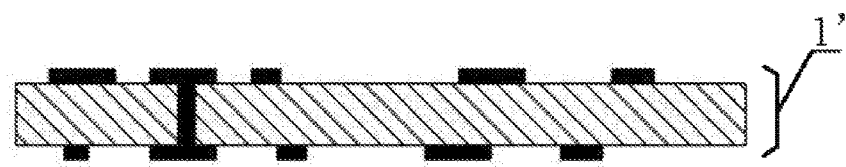
FIG. 5a~5h illustrate a SAP using an ABF in the prior art.
Figure 5B:
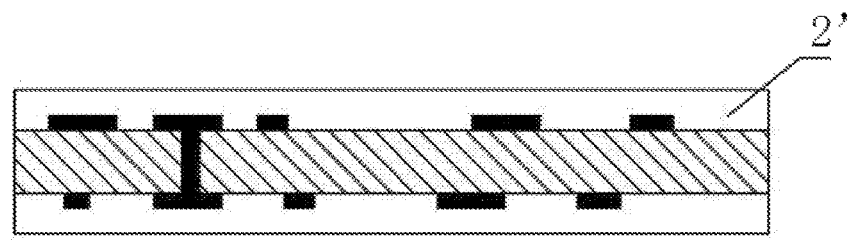
Figure 5C:
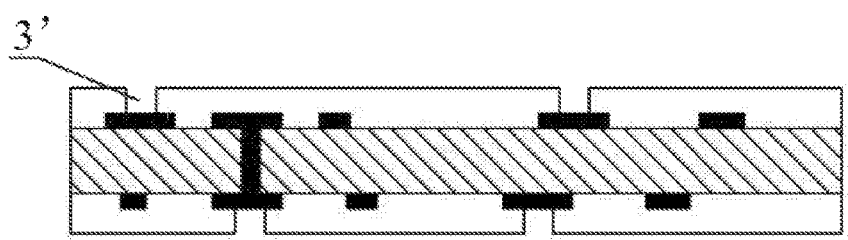
Figure 5D:
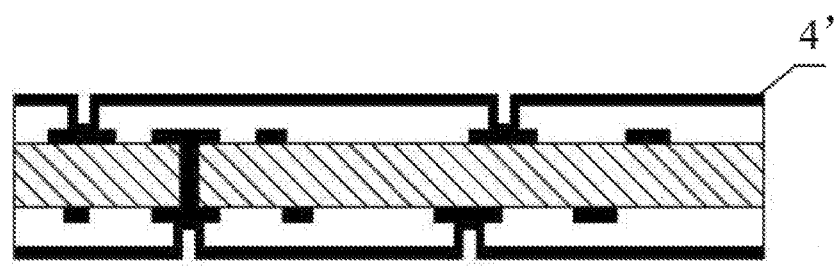
Figure 5E:
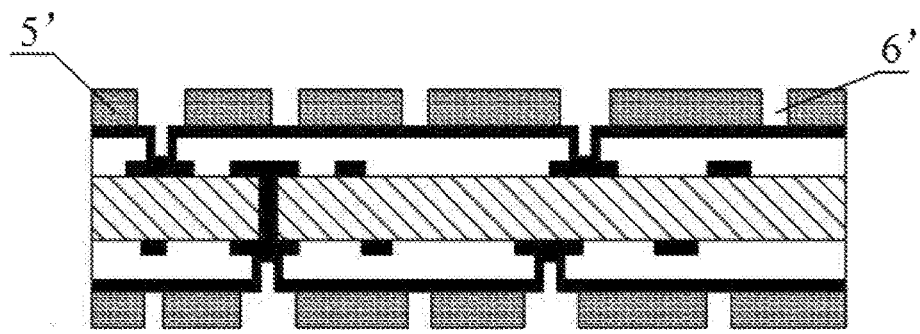
Figure 5F:
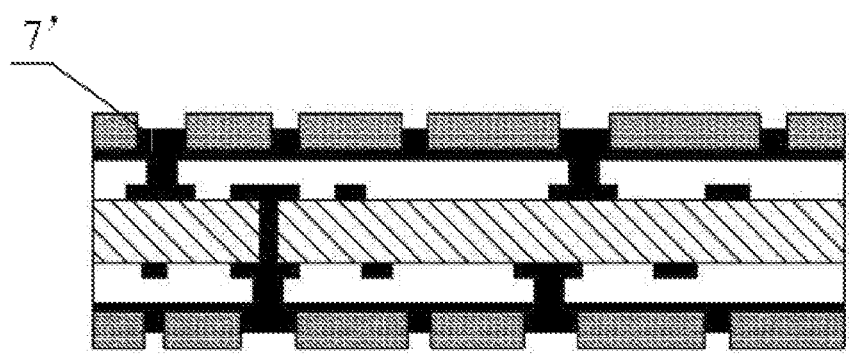
Figure 5G:
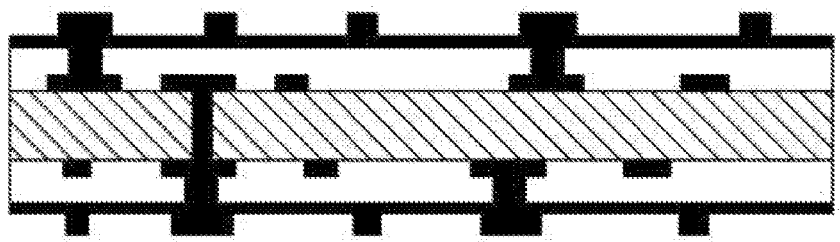
Figure 5H:
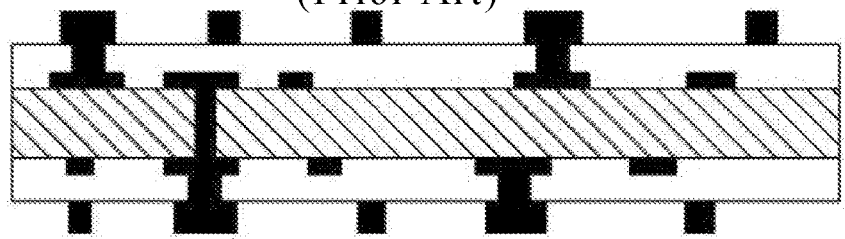
Figure 6A:
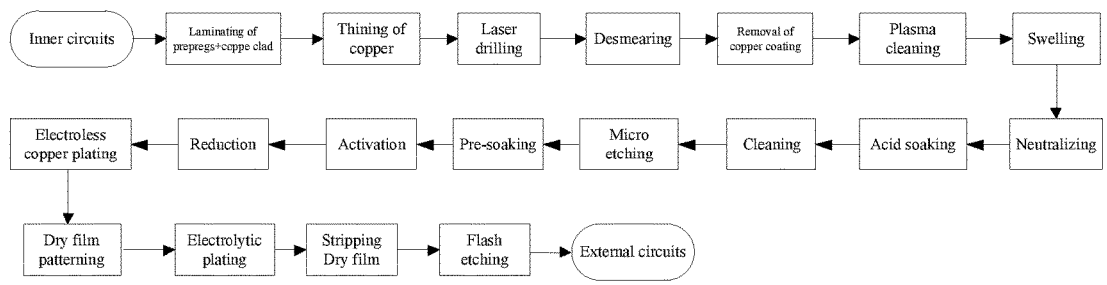
FIG. 6a~6b illustrates the flow chart of a method for constructing an external circuit structure in an embodiment of the present invention.
Figure 7A:
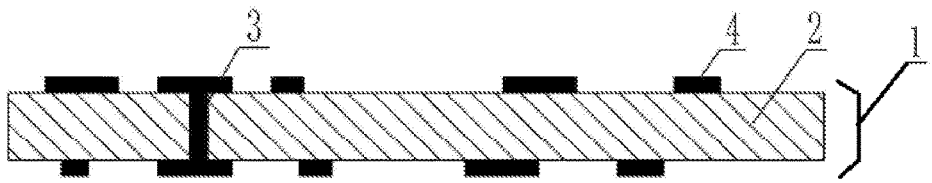
FIG. 7a~7k illustrate a method for constructing an external circuit structure in an embodiment of the present invention.

Step 301: as shown in FIG. 7a, an inner circuit substrate 1 is manufactured. The manufacturing process includes: a via-hole 3 is drilled on a core board 2 and then copper circuits 4 are constructed on both surfaces of the core board 2. A subtractive process may be applied to make the inner circuits if its line width is large.

Figure 7B:
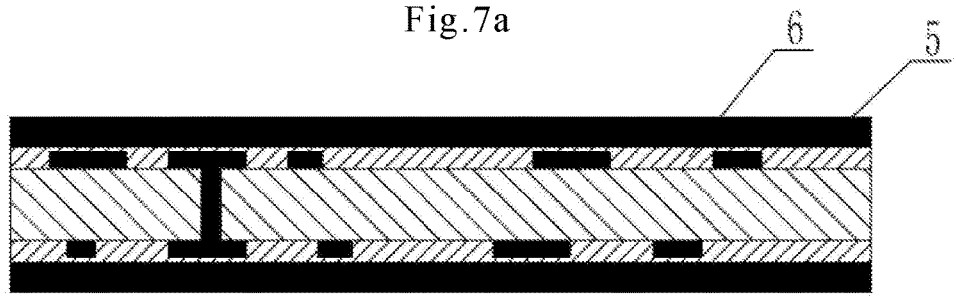

Step 302: as shown in FIG. 7b, prepregs 6 and copper foils 5 are respectively laminated onto both sides of the inner circuit substrate 1, wherein, each prepreg 6 is laminated between the copper foil 5 and the inner circuit substrate. After this step, the low surface roughness of the copper foils 5 is transferred to the surface of the prepregs 6 respectively.

Figure 7C:
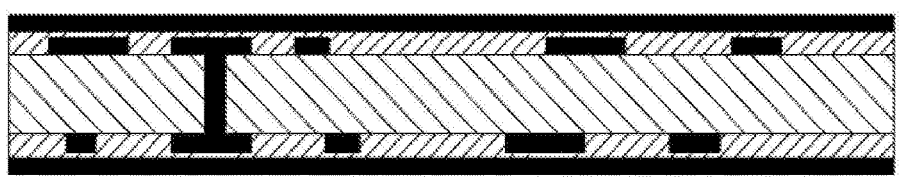

Step 303: as shown in FIG. 7c, the copper foils 5 on both sides are thinned to a thickness of 3 μm. This step aims to reduce the copper etching of the inner copper pads at the bottom of blind vias during a subsequent copper foil removing step.

Those skilled in the art can understand that, a thinner copper foil may be directly applied. In this case, the thinning process in Step 303 may be not necessary.

Figure 7D:
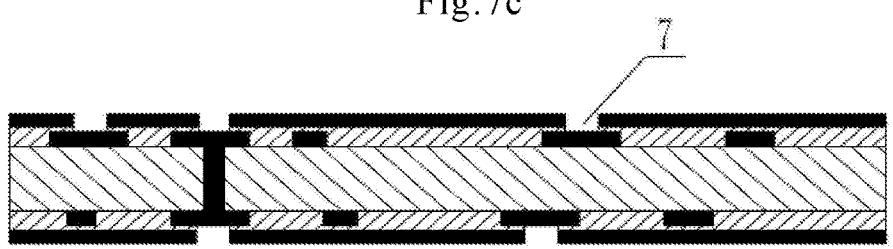
Figure 6B:
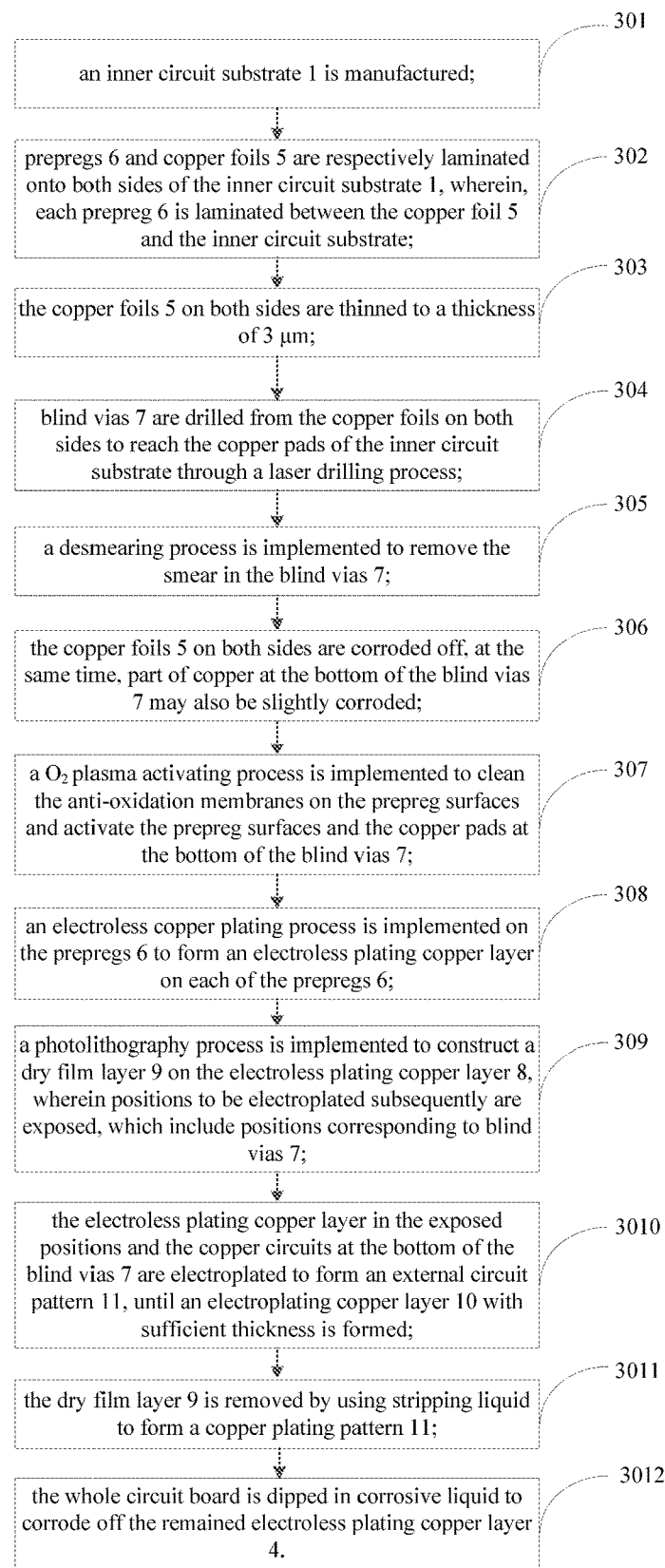

Step 304: as shown in FIG. 7d, blind vias 7 are drilled from the copper foils on both sides to reach the copper pads of the inner circuit substrate through a laser drilling process.

The blind vias 7 will be filled with conductive material to interconnect the external circuit with the copper pads of the inner circuit substrate in subsequent steps.

Those skilled in the art can understand that, in another embodiment of the present invention, one or more blind vias may be drilled. The number of the blind vias should not be used to limit the protection scope of the present invention.

Step 305: as shown in FIG. 7d, a desmearing process is implemented to remove the smear in the blind vias 7.

After the laser drilling process, some smear may be generated in the blind vias 7. The smear may affect the adhesion of electroless plated copper to be formed inside of the blind vias 7 by subsequent steps and the interconnection between the external and inner circuits. The desmearing process may be implemented through a chemical etching process or a plasma cleaning process. In the present invention, the desmearing process is implemented before the copper foils on the prepregs are corroded off, thus the prepregs can be protected by the copper foils from being etched by the desmearing liquid, so that the surface roughness of the prepregs, which is transferred from the copper foils, can be remained.

In an embodiment of the present invention, before the desmearing process, the blind vias may be swelled in advance to improve the effect of the desmearing process.

Figure 7E:

Step 306: as shown in FIG. 7e, the copper foils 5 on both sides are corroded off, at the same time, part of copper at the bottom of the blind vias 7 may also be slightly corroded. Since the blind vias 7 are small and the solution-exchange capability is poor, only a little of the copper at the bottom of the blind vias 7 is corroded, which depends on the thickness of the copper foils 5.

In order to minimize the corroding time, as described in Step 303, thinner copper foils may be applied, or a thinning process may be applied to thin thick copper foils to a thickness of 3 μm before Step 306.

Actually, the slight corrosion at the bottom of the blind vias 7 will be helpful to improve the adhesion of the copper electroplated in the blind vias 7 in subsequent steps.

Step 307: as shown in FIG. 7e, a $O_2$ plasma activating process is implemented to clean the anti-oxidation membranes on the prepreg surfaces and activate the prepreg surfaces and the copper pads at the bottom of the blind vias 7.

Since the copper foils may include anti-oxidation membranes on their surfaces, the anti-oxidation membranes may be laminated on the prepreg surfaces along with the copper foils during Step 302, which will affect the adhesion of the electroless plating copper layer if they are left on the prepreg surfaces after Step 306. The activating process can remove the anti-oxidation membranes by using a $O_2$ plasma treatment, and the subsequent desmearing process without swelling can take less one minute to entirely etch off the anti-oxidation membranes.

The activating process will improve the affinity of the electroless copper plating liquid and the capability of reagents used to wet the prepreg in subsequent surface treatments, such as swelling, neutralizing, acid soaking, cleaning, micro corroding, and pre-soaking, before the electroless copper plating process; further improve the capability of the prepreg for absorbing the palladium which is the activator of the electroless copper plating liquid, and finally improve the adhesion of the copper formed from electroless plating.

Figure 7F:
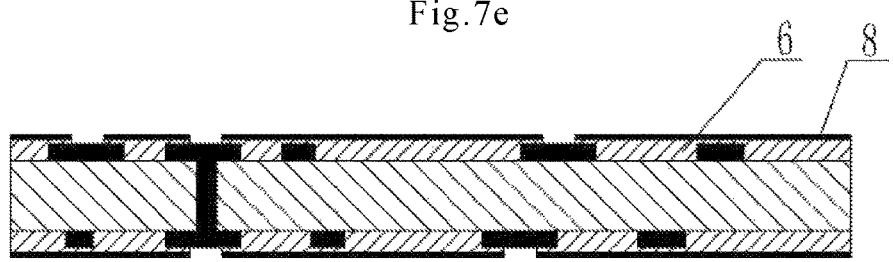
Figure 8:
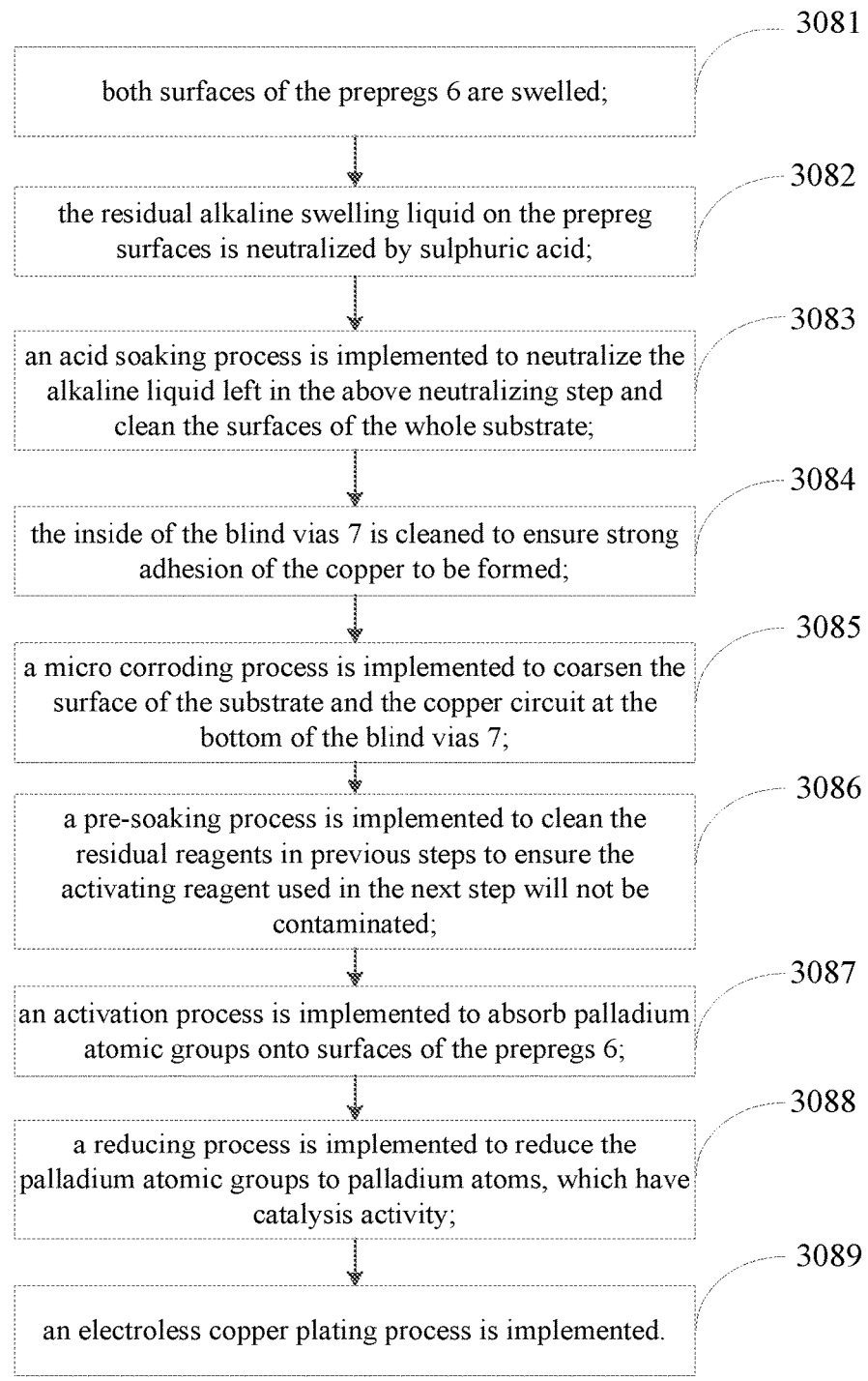
FIG. 8 illustrates the flow chart of an electroless copper plating process in a method for constructing an external circuit structure in an embodiment of the present invention.

Step 308: as shown in FIG. 7f, an electroless copper plating process is implemented on the prepregs 6 to form an electroless plating copper layer on each of the prepregs 6. As shown in FIG. 8, the process includes following steps.

Step 3081: both surfaces of the prepregs 6 are swelled, so that the distances between molecules of the prepreg surfaces and the superficial area of the micro structure are increased, therefore palladium atoms in the activation liquid will be easily absorbed into the molecules to achieve stronger adhesion of the copper formed from electroless plating.

Step 3082: the residual alkaline swelling liquid on the prepreg surfaces is neutralized by sulphuric acid. Therefore a conditioning reagent may be applied to modify the exposed glass cloth inside the blind vias 7 to form a neutral chemical layer on the surface of glass cloth, so that the negative charge on the surface of glass cloth can be neutralized and therefore the absorption of palladium in subsequent processes can be improved.

Step 3083: an acid soaking process is implemented to neutralize the alkaline liquid left in the above neutralizing step and clean the surfaces of the whole substrate Step 3084: the inside of the blind vias 7 is cleaned to ensure strong adhesion of the copper to be formed;

Step 3085: a micro corroding process is implemented to coarsen the surface of the substrate and the copper circuit at the bottom of the blind vias 7, which will increase the adhesion of the copper formed from electroless plating in the blind vias 7 and on the substrate.

Step 3086: a pre-soaking process is implemented to clean the residual reagents in previous steps to ensure the activating reagent used in the next step will not be contaminated. Pre-soaking agent has many similar components with activation agent, so carrying little pre-soaking agent into the activation agent will have much little affect on an subsequent activation process.

Step 3087: an activation process is implemented to absorb palladium atomic groups onto surfaces of the prepregs 6, the surface of glass cloth regulated and the copper surfaces of the inner circuit substrate, to form a catalyst layer to be used in subsequent steps. Normally, the palladium absorbing capability of the prepreg surfaces is larger than that of glass cloth, while palladium absorbing capability of glass cloth is larger than that of the copper surface.

Step 3088: a reducing process is implemented to reduce the palladium atomic groups to palladium atoms, which have catalysis activity.

Step 3089: an electroless copper plating process is implemented. After the previous surface treatments, a layer of palladium atoms is formed on surfaces of the prepregs 6. Copper ions in electroless copper plating liquid are reduced to copper atoms by using the catalysis activity of the palladium atoms, and the copper atoms are further absorbed onto the prepreg surfaces to form an electroless plating copper layer 8.

Figure 7G:
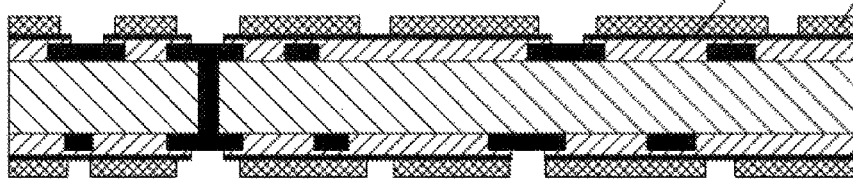

Step 309: as shown in FIG. 7g, a photolithography process is implemented to construct a dry film layer 9 on the electroless plating copper layer 8, wherein positions to be electroplated subsequently are exposed, which include positions corresponding to blind vias 7.

Figure 7H:
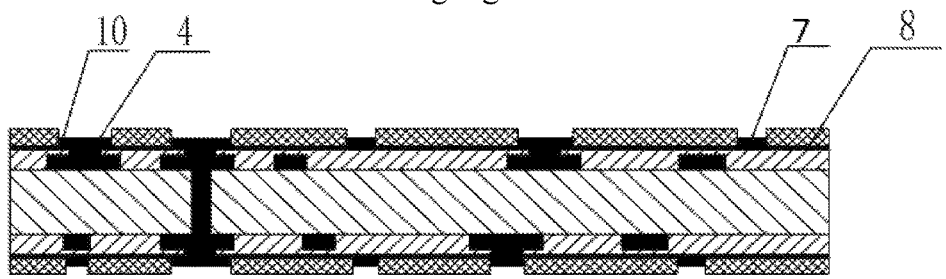

Step 3010: as shown in FIG. 7h, the electroless plating copper layer in the exposed positions and the copper circuits at the bottom of the blind vias 7 are electroplated to form an external circuit pattern 11, until an electroplating copper layer 10 with sufficient thickness is formed.

Figure 7I:
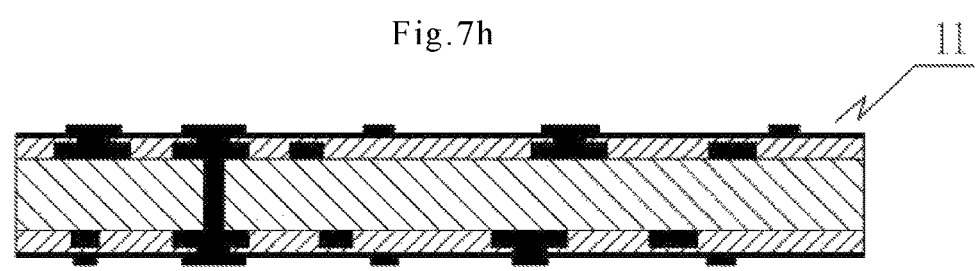

Step 3011: as shown in FIG. 7i, the dry film layer 9 is removed by using stripping liquid to form a copper plating pattern 11.

Figure 7J:
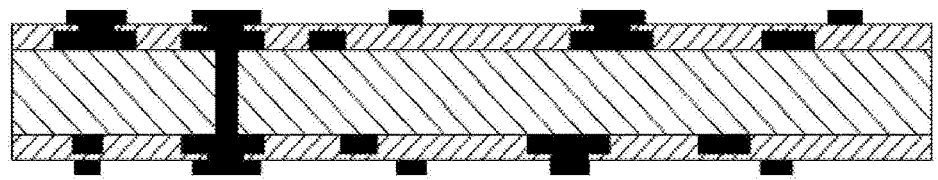

Step 3012: as shown in FIG. 7j, the whole circuit board is dipped in corrosive liquid to corrode off the remained electroless plating copper layer 4. Since the electroless plating copper layer 8 is very thin so that it can be corroded off rapidly. Thus, an external circuit structure is formed.

During the corroding process, a little of copper formed from electroplating is also corroded off. However, since the structure of the electroplating copper is much denser than that of the electroless copper, and the grain size is much bigger, the corroding speed on the electroplating copper layer is much slower. Therefore only a little of the electroplating copper layer is corroded off while the entire exposed electroless plating copper layer has been corroded off. In this case, the circuit accuracy can be preciously controlled by adjusting the manufacturing thickness of the electroless plating copper layer, which is an essential procedure to achieve a fine circuit line/space.

Figure 7K:
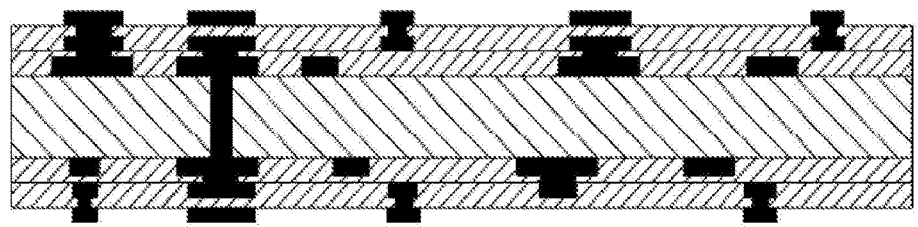

As shown in FIG. 7k, more external circuit structures can be constructed by repeating the step 302~3012.

In the technical scheme of the present invention, the desmearing process (Step 305) is implemented before the copper foils on the prepregs are corroded off, thus the prepreg can be protected by the copper foil from being etched by the desmearing liquid, so that the surface roughness of the prepreg, which is transferred from the copper foil, can be remained.

During the electroless copper plating process, only swelling but no desmearing is required, so that the swelled prepreg surface can be obtained and remained, and then the molecular separation of the prepreg surface can be increased and the superficial area of the micro structure can be extended, which can make the palladium atoms in activation liquid easily be absorbed by the prepreg surface in subsequent steps, and finally an excellent adhesion of the electroless plating copper layer can be achieved.

During the whole method provided by the present invention, only common copper foils and prepreg are used instead of high-cost materials such as PCF or ABF in the prior art. The material cost is largely reduced, which is only half of PCF and ⅓ of ABF.

Compared with the prior art, besides the advantages have described above, the technical scheme of the present invention further has following advantages.

The equipment cost is low. The ABF material can only be laminated by a two-stage vacuum laminator, which is far more expensive than normal vacuum laminator. Therefore, the present invention saves a lot on equipment than a SAP using the ABF.

The process is simpler compared with SAP using ABF. As for PCB manufacturers, the ABF is a completely new material and new equipment are required, while the technical scheme of the present invention can be applied on currently equipment, no new equipment is needed.

The final structure constructed by the present invention is the same as that constructed by the conventional subtractive process, which is more easily accepted by users based on its reliability and practicality.

The above contents are the descriptions of the preferred embodiments of the present invention, which cannot be used to limit the protection scope of the present invention. Under the principle and the novel feature of the present invention, any modifying, equivalent replacement, improvement, etc. are all considered to be within the protection scope of the present invention.

The invention claimed is:

1. A method for constructing an external circuit structure, applied to an inner circuit substrate, which comprises: a core board, both surfaces of which are coated with copper circuits; at least one via-hole, drilled through the core board and filled with conductive medium, wherein, the method comprises:
   laminating a copper foil and a prepreg on the inner circuit substrate; wherein, the prepreg is laminated between the copper foil and the inner circuit substrate;
   drilling at least one blind via from the copper foil through the prepreg to reach one of the copper circuits coated on the core board;
   desmearing the at least one blind via;
   after the desmearing step, corroding off the copper foil;
   after the corroding step, electroless copper plating on the prepreg to form an electroless plating copper layer on the prepreg; wherein, during the electroless copper plating process, swelling a surface of the prepreg with alkaline swelling liquid, thereby increasing a distance between molecules of the surface of the prepreg and superficial area of a micro structure of the prepreg; and neutralizing the alkaline swelling liquid left on the surface of the prepreg.

2. The method of claim 1, wherein:
the electroless copper plating process further comprises:
   wherein the neutralizing, including acid soaking the surface of the prepreg, to neutralize the alkaline swelling liquid left in the neutralizing step and clean the surface of the prepreg;
   cleaning inside of the at least one blind via;
   micro corroding to coarsen the copper circuit at the bottom of the at least one blind via and the surface of the prepreg;
   pre-soaking to clear reagent left in previous steps;
   activating the surface of the prepreg to absorb palladium atomic groups onto the surface of the prepreg;
   reducing the palladium atomic groups to palladium atoms.

3. The method of claim 2, wherein, after neutralizing the alkaline swelling liquid left on the surface of the prepreg, the electroless copper plating process further comprises:
   modifying exposed glass cloth inside the at least one blind via by using a regulator reagent to form a neutral chemical modification layer on a surface of the glass cloth.

4. The method of claim 1, wherein, the inner circuit substrate is constructed through a subtractive process.

5. The method of claim 1, wherein the laminating step further comprises laminating a prepreg on the inner circuit substrate and then laminating a copper foil onto the prepreg, and the method further comprises:
   thinning the copper foil to a thickness of 3 μm.

6. The method of claim 1, wherein, the drilling process is implemented through a laser drilling process.

7. The method of claim 1, wherein, the desmearing process is conducted through a chemical etching process or a plasma cleaning process.

8. The method of claim 1, wherein, before electroless copper plating on the prepreg, the method further comprises:
   plasma activating a surface of the prepreg, including the copper circuit at the bottom of the blind vias.

9. The method of claim 1, wherein, after electroless copper plating on the prepreg, the method further comprises:
   implementing a photolithography process on the electroless plating copper layer to construct a dry film outside the electroless plating copper layer, wherein positions corresponding at least to the at least one blind via are exposed for subsequent electroplating;
   electroplating on the electroless plating copper layer in the exposed positions and the copper circuit at the bottom of the at least one blind via to form a copper plating pattern;
   removing the dry film layer to form a substrate with the copper plating pattern;
   corroding off the electroless plating copper layer by dipping the circuit substrate in an corrosive liquid.

10. The method of claim 9, wherein, the dry film layer is removed by using stripping liquid.

* * * * *